United States Patent
Shayani et al.

(10) Patent No.: US 9,984,181 B2
(45) Date of Patent: May 29, 2018

(54) JUNCTION MESHING FOR LATTICE STRUCTURES

(71) Applicant: Within Technologies Ltd., London (GB)

(72) Inventors: Hooman Shayani, Longfield (GB); Srikanth Reddy Bethi, Bromley (GB)

(73) Assignee: Within Technologies Ltd., London (GB)

(*) Notice: Subject to any disclaimer, the term of this patent is extended or adjusted under 35 U.S.C. 154(b) by 0 days. days.

(21) Appl. No.: 15/133,109

(22) Filed: Apr. 19, 2016

(65) Prior Publication Data

US 2016/0232262 A1 Aug. 11, 2016

Related U.S. Application Data

(60) Provisional application No. 62/155,348, filed on Apr. 30, 2015, provisional application No. 62/215,958, filed on Sep. 9, 2015.

(51) Int. Cl.
*G06F 7/60* (2006.01)
*G06F 17/10* (2006.01)
(Continued)

(52) U.S. Cl.
CPC .......... *G06F 17/5009* (2013.01); *G06T 17/10* (2013.01); *G06T 17/20* (2013.01)

(58) Field of Classification Search
None
See application file for complete search history.

(56) References Cited

U.S. PATENT DOCUMENTS 4,562,682 A * 1/1986 Arvedi ............... E04B 1/19
 403/171
5,748,865 A * 5/1998 Yamamoto ........... G01B 11/24
 345/423

(Continued)

FOREIGN PATENT DOCUMENTS

WO WO 2015/040410 3/2015

OTHER PUBLICATIONS

Veszpremi, Operation and performance of the CMS tracker Feb. 2014, Wigner Research Centre, pp. 1-10.*

(Continued)

*Primary Examiner* — Omar Fernandez Rivas
*Assistant Examiner* — Bernard E Cothran
(74) *Attorney, Agent, or Firm* — Fish & Richardson P.C.

(57) ABSTRACT

Methods, systems, and apparatus, including medium-encoded computer program products, for designing three dimensional lattice structures include, in one aspect, a method including: calculating a radius of incidence for respective pairings of beams of different sizes that converge at a junction in a lattice; determining a maximized radius of incidence for each of the beams based on the radii of incidence for the pairings with that beam; comparing the maximized radii of incidence to find a global radius for the junction; calculating local intersection points and global intersection points, respectively, for each of the beams with a local sphere defined by the maximized radius of incidence for that beam and with a global sphere defined by the global radius for the junction; and generating meshing with sockets for the beams at the junction using the local intersection points and the global intersection points.

22 Claims, 13 Drawing Sheets

(51) Int. Cl.
G06F 17/50 (2006.01)
G06T 17/10 (2006.01)
G06T 17/20 (2006.01)

(56) References Cited

U.S. PATENT DOCUMENTS

| | | | |
|---|---|---|---|
| 2004/0107669 A1* | 6/2004 | Francom | E04C 3/08 52/697 |
| 2004/0261953 A1* | 12/2004 | Hart | E04B 7/14 160/80 |
| 2006/0170999 A1* | 8/2006 | Sloan | H04N 1/6058 358/520 |
| 2006/0292388 A1* | 12/2006 | Palumbo | A61F 2/82 428/586 |
| 2014/0156053 A1 | 6/2014 | Mahdavi et al. | |
| 2016/0229127 A1* | 8/2016 | Halliday | B29C 67/0092 |
| 2016/0283619 A1* | 9/2016 | Yu | G06F 17/5009 |

OTHER PUBLICATIONS

Teufelhart et al., Optimization of Strut Diameters in Lattice Structures, Fraunhofer Institute for Machine Tools and Forming Technologies (IWU), pp. 719-733.*
Merkle, Molecular Space Frames: An Atomically Precise Aerogel, 2014, Molecular Space Frames, pp. 1-16.*
Barber et al., "The Quickhull Algorithm for Convex Hulls," ACM Transactions on Mathematical Software, 1996, 22(4):469-483.
de Berg et al., "Computational Geometry—Algorithms and Applications," Third Edition, Springer, 2008, Chapter 11, Convex Hulls, pp. 243-258.
Peterson, "Computing Constrained Delaunay Triangulations in the Plane," (Jan. 2, 2015) [online] (retrieved from http://www.geom.uiuc.edu/~samuelp/del_project.html), 18 pages.
Practical Algorithms for 3D Computer Graphics, Second Edition, by R. Stuart Ferguson, pp. 20 and 21, section 2.8 (4 pages).
Unknown Author, "Cross product—Wikipedia, the free encyclopedia," (Dec. 31, 2014) [online] (retrieved from http://en.wikipedia.org/wiki/Cross_product), 23 pages.
Unknown Author, "Stereographic Projection—from Wolfram MathWorld," (Dec. 31, 2014) [online] (retrieved from http://mathworld.wolfram.com/StereographicProjection.html), 2 pages.
Unknown Author, "Trabecula—Wikipedia the free encyclopedia," (Jan. 6, 2015) [online] (retrieved from http://en.wikipedia.org/wiki/Trabecula), 2 pages.
Unknown Author, "Within—Acetabular Cups Revised," (Jan. 6, 2015) [online] (retrieved from http://withinlab.com/case-studies/index13.php), 2 pages.
Ruto et al, "Within Enhance Technical Manual for Version 4.2," Mar. 31, 2014, 31 pages.
Ruto et al, "Within Enhance Technical Manual for Version 4.3," Jan. 15, 2015, 32 pages.
Ruto, "Within Medical Technical Manual for Version 4.2," Mar. 15, 2013, 48 pages.
Ruto, "Within Medical [Biomet Edition] Technical Manual for Version 4.2," Mar. 13, 2013, 27 pages.
Bethi, "Within Topology Editor Technical Manual for Version 1.0," Jun. 12, 2013, 16 pages.
Ruto, "Within Variable Technical Manual for Version 4.2," Jun. 26, 2013, 20 pages.
Ruto, "Within Lite Technical Manual for Version 4.2," Apr. 31, 2013, 18 pages.
Ruto et al., "Within Enhance Technical Manual for Version 4.1," Jul. 5, 2013, 45 pages.
International Search Report and Written Opinion in PCT/IB2016/052363, dated Aug. 24, 2016, 12 pages.
Hussein et al., "Advanced Lattice Support Structures for Metal Additive Manufacturing," Journal of Materials Processing Technology, 2013, 213:1019-1026.
Anonymous, "Promoting Powder Metallurgy Technology—Introduction to Additive Manufacturing Technology," (May 15, 2013) [online] (retrieved from http://www.sf2m.asso.fr/CommissionsThematiques/DocComThematiques/EPMA_Additive Manufacturing.pdf), 44 pages.
G. Hart, "Sculptural Forms from Hyperbolic Tessellations", Proceedings of IEEE Shape Modeling International 2008, pp. 155-161, 2008, 7 pages.
Y. Hijazi et al., "Fully-automatic Branching Reconstruction Algorithm: Application to Vascular Trees", Shape Modeling International Conference (SMI), 2010, pp. 221-225, 2010, 5 pages.

* cited by examiner

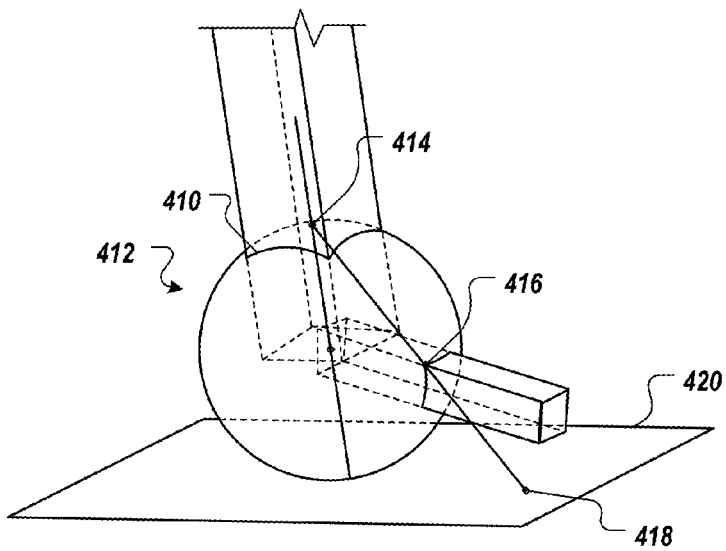
FIG. 4B
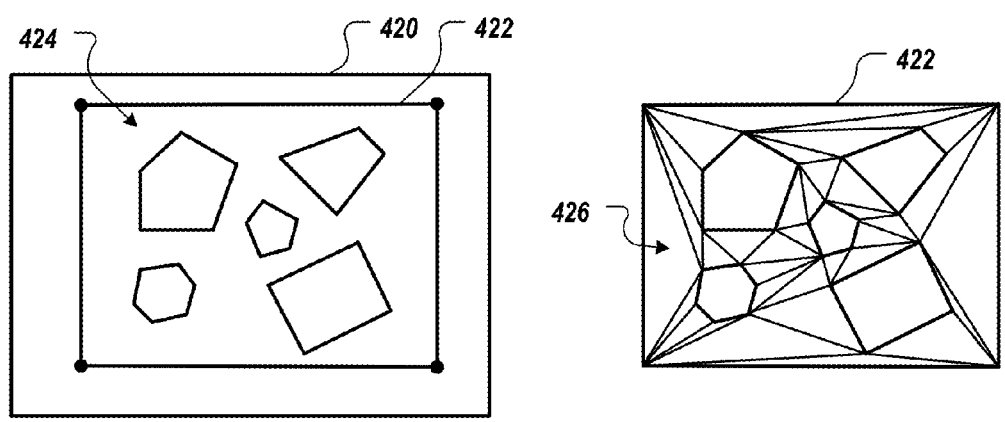
FIG. 4C
FIG. 4D

JUNCTION MESHING FOR LATTICE STRUCTURES

CROSS-REFERENCE TO RELATED APPLICATIONS

This application claims the benefit under 35 U.S.C. § 119(e) of U.S. Patent Application No. 62/155,348, filed Apr. 30, 2015, and also U.S. Patent Application No. 62/215,958, filed Sep. 9, 2015, both entitled "JUNCTION MESHING FOR LATTICE STRUCTURES".

BACKGROUND

This specification relates to computer aided structure creation, such as generation of lattice structures for use with three dimensional (3D) modeling programs for use with additive manufacturing or other manufacturing techniques.

Computer-aided design (CAD) software has been developed and used to generate 3D representations of objects. Such software has also included software tools that can be used to enhance 3D parts using lattices and skins of various sizes, thicknesses and densities. Such tools allow rapid redesign of a 3D part to be lighter in weight, while still maintaining desired performance characteristics (e.g., stiffness and flexibility). Such software tools have used lattice topologies of various types that can be used to generate internal lattice structures that can be manufactured.

SUMMARY

This specification describes technologies relating to computer aided structure creation, such as generation of lattice structures with 3D modeling programs for use with additive manufacturing or other manufacturing methods.

In general, one or more aspects of the subject matter described in this specification can be embodied in one or more methods that include calculating a radius of incidence for respective pairings of beams of different sizes that converge at a junction in a lattice; determining a maximized radius of incidence for each of the beams based on the radii of incidence for the pairings with that beam; comparing the maximized radii of incidence to find a global radius for the junction; calculating local intersection points and global intersection points, respectively, for each of the beams with a local sphere defined by the maximized radius of incidence for that beam and with a global sphere defined by the global radius for the junction; generating meshing with sockets for the beams at the junction using the local intersection points and the global intersection points; and connecting the beams with the sockets at the junction to form a mechanically robust structure for the lattice.

Each of the beams of different sizes can be a tapered beam represented by an axis, a first end beam thickness value and a second end beam thickness value, and the lattice can be generated using variation in beam thickness and junction placement within the lattice. Each tapered beam can be further represented by a cross-sectional two dimensional (2D) shape corresponding to beam cross section profile, and the lattice can be generated using variation in the beam cross section profile.

Calculating a radius of incidence for a pair of the beams at the junction can include: calculating a cross product of beam axis vectors for the two beams of the pair to find a normal vector defining a 2D plane in which the beam axis vectors lie at the junction; calculating a cross product of the normal vector with a first of the beam axis vectors to find a first thickness vector in the 2D plane at the junction; calculating a cross product of the normal vector with a second of the beam axis vectors to find a second thickness vector in the 2D plane at the junction; calculating an edge intersection point of edges of the two beams within the 2D plane using the first thickness vector, the second thickness vector, and data defining the edges of the two beams; and finding the radius of incidence from the edge intersection point and a center point of the junction.

Determining a maximized radius of incidence for each of the beams based on the radii of incidence for the pairings with that beam can include: determining a maximum radius of incidence; and adding a margin amount to the determined maximum radius of incidence to generate the maximized radius of incidence. Generating the meshing with sockets for the beams at the junction in the lattice can include: identifying a thickest beam of the three or more beams at the junction in the lattice; using a stereographic projection with reference to an axis of the thickest beam to project the global intersection points to a 2D plane normal to the axis of the thickest beam; generating triangulation between projected points in the 2D plane normal to the axis of the thickest beam; and mapping connectivity of the triangulation to the local intersection points of the three or more beams to form the meshing with sockets for the three or more beams at the junction in the lattice. In addition, generating the triangulation can include using Constrained Delaunay Triangulation (CDT).

Generating the meshing with sockets for the beams at the junction in the lattice can include: generating triangulation between the global intersection points by calculating a 3D convex hull using as input points, both the global intersection points, and end points of the beams at the junction; removing socket triangles from the triangulation; and mapping connectivity of the triangulation to the local intersection points of the beams to form the meshing with sockets for the beams at the junction in the lattice. The method can also include performing the method for multiple junctions in the lattice, where the multiple junctions have a varying number of intersecting beams, and at least one junction of the multiple junctions has only two beams meeting at the at least one junction, and at least one other junction of the multiple junctions has three or more beams meeting at this other junction.

The method can include generating and using a local radius for each beam socket point. Determining the maximized radius of incidence for each of the three or more beams can include determining a maximized radius of incidence for each of three or more corner lines for each of the three or more beams based on radii of incidence for pairings of that corner line's beam with beams connected with that corner line's socket point by triangulation. Further, calculating the local intersection points can include calculating local intersection points for the three or more corner lines of each of the three or more beams with local spheres defined by the maximized radius of incidence for each of the three or more corner lines of each respective beam.

The method can include: subdividing edges between sockets using a number of points, edges and triangles; and determining radii of the subdivision points using a blending function with two of the socket points of an edge and the intersection point of beam corner lines as three control points of the blending function. Generating the meshing with sockets for the beams at the junction in the lattice can include: generating triangulation using the global intersection points, the triangulation being edges between corner lines of different beams; subdividing the edges between the corner lines of the different beams to form subdivision points; and determining a new position for each of the subdivision points using a blending function, each new position being closer to a center point of the junction than a previous position for that subdivision point.

According to another aspect, a system can include: a non-transitory storage medium having instructions of a three dimensional (3D) modeling program stored thereon; and one or more data processing apparatus configured to run the instructions of the 3D modeling program to perform the various operations of the method(s). In addition, the system can include an additive manufacturing machine, where the one or more data processing apparatus are configured to run the instructions of the 3D modeling program to generate a 3D model of an object that includes the lattice and output the 3D model to the additive manufacturing machine for additive manufacturing of the object with the mechanically robust structure of the junction of the lattice included therein.

Particular embodiments of the subject matter described in this specification can be implemented to realize one or more of the following advantages. Junction meshing (e.g., triangular meshes) can be generated quickly for beam junctions in a lattice for use in portions of a 3D model of an object to be manufactured. The resulting lattice structure can be mechanically robust and have near optimum (or optimum) junctions, in terms of material usage, without excessive processing time being required. An algorithm for generating meshes for lattice structures can handle various numbers of beams at a junction, where the beams can be of different sizes and shapes, and be connected to each other at arbitrary angles. This can allow more variability (e.g., design freedom in multiple aspects of the beams and junctions within a lattice) to be added to a lattice structure, which can increase the strength of the manufactured structure. In addition, increase in variability of the lattice structure can be used to achieve other improvements in the structure, e.g., pseudo random variations in multiple aspects of the beams and junctions within a lattice can result in increased facilitation of bone growth connections into the lattice structure in an implantable device, without sacrificing internal structural strength or manufacturability, and without introducing a computational process that is too intensive. This can be of substantial significance when there are hundreds of thousands of beams in a lattice structure. Direct and fast generation of triangular meshes can be achieved for mechanically robust junctions between tapered beams of arbitrary angles and thicknesses with near optimal use of material and controlled number of polygons. Moreover, the number of polygons and accuracy of the meshing can be increased by a subdivision mechanism in a controlled manner.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

FIG. 4B shows an example of using a stereographic projection to project points of a master beam onto a 2D plane.

FIGS. 4C and 4D show an example of using a Constrained Delaunay Triangulation (CDT) method to triangulate the area between projections of the beam sockets on a 2D plane for use in meshing the junction.

Like reference numbers and designations in the various drawings indicate like elements.

DETAILED DESCRIPTION

Figure 1:
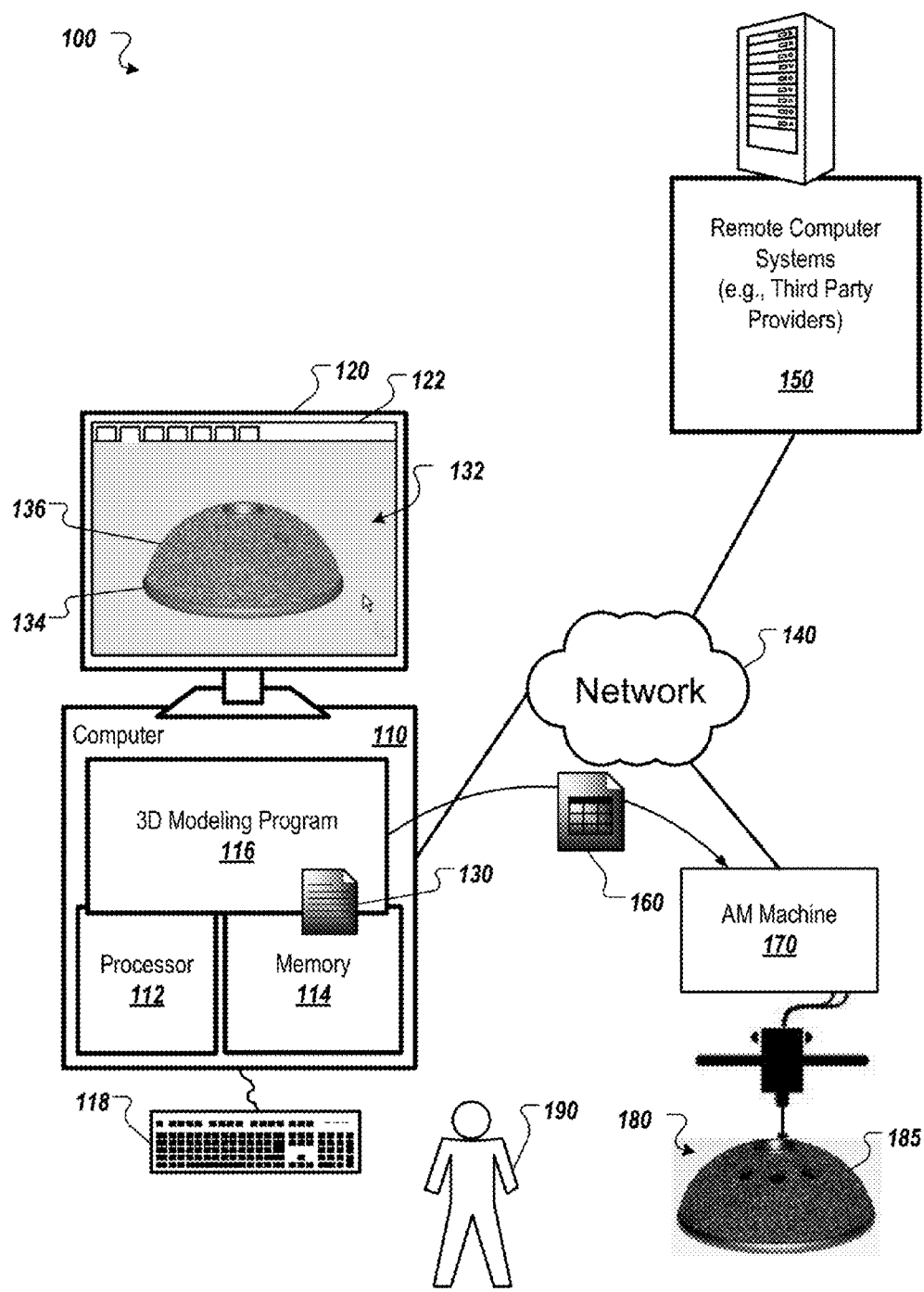
FIG. 1 shows an example of a system usable to design and manufacture lattice structures with random or arbitrary variations in beam dimensions and positioning.

FIG. 1 shows an example of a system 100 usable to design and manufacture lattice structures with random or arbitrary variations in beam dimensions and positioning. In the example shown, an additive manufacturing machine is used, but the invention is not limited to use with a particular type of manufacturing system. For example, the systems and techniques described herein can be used with various types of additive manufacturing (AM), three dimensional (3D) printing, subtractive manufacturing (SM), investment casting, etc.

A computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112.

Such programs can include a 3D modeling program 116, which can run locally on computer 110 or remotely on a computer of one or more remote computer systems 150 (e.g., one or more third party providers' one or more server systems accessible by the computer 110 via the network 140). The 3D modeling program 116 presents a user interface (UI) 122 on a display device 120 of the computer 110, which can be operated using one or more input devices 118 of the computer 110 (e.g., keyboard and mouse). Note that while shown as separate devices in FIG. 1, the display device 120 and/or input devices 118 can also be integrated with each other and/or with the computer 110, such as in a tablet computer.

A user 190 can interact with the 3D modeling program 116 to create a 3D model 132. This can be done using known graphical user interface tools. The 3D model includes a portion 134 that is a traditional 3D model component, which can be defined using solid models (e.g., voxels) or surface models (e.g., B-Rep (Boundary Representation), surface meshes). In addition, the UI 122 of the program 116 can allow the user 190 to provide input specifying one or more regions of the 3D model in which to generate a lattice 136. For example, in some implementations, the user 190 can define a B-rep and specify a general type of lattice to include on one side of that B-rep, then the computer 110 can automatically generate the full lattice 136, including adding variation to the internal structure of the lattice 136. In some cases, the variation can be entirely arbitrary, and in other cases, the variation can be governed by one or more factors, such as how close the portion of the lattice 136 is to specified location(s) or surface(s) within the 3D model 132 or how some beams in the lattice need to bear loads in different directions. In some implementations, the lattice 136 can be generated with random (or pseudorandom) variations in beam shape and type, length, thickness, orientation with respect to the junctions, or a combination of these.

In the example shown, the 3D model is of an acetabular cup, which is the portion of a hip replacement implant that is placed into the hip socket, and so the lattice 136 is added to improve the ability of the hip bone to grow into, and thus attach to, the acetabular cup. This is but one of many possible 3D models that can be designed and improved using lattice structures. For example, with additive manufacturing systems and techniques, there is opportunity to make parts both lighter and stronger by replacing internal regions of the part with lattice structures. In addition, using the systems and techniques described further below, such lattice structures can be created automatically with improved junction meshing.

The 3D modeling program 116 can also facilitate manipulation of the 3D model 132, which can include adding, deleting, or changing components 134 of the model 132, including components that intersect with the lattice 136, and also changing the extent and inclusion of the lattice 136 (e.g., by defining a containing envelope for the lattice structure 136). Once the user 190 is satisfied with the model 132 and its lattice 136, the 3D model 132 and its lattice 136 can be stored as a document 130 and/or used to generate another representation of the model (e.g., an .STL file for additive manufacturing) with the lattice 136 included therein. This can be done upon request by the user 190, or in light of the user's request for another action, such as sending the 3D model 132 to an AM machine 170, or other manufacturing machinery, which can be directly connected to the computer 110, or connected via a network 140, as shown. This can involve a post-process carried out on the local computer 110 or a cloud service to export the 3D model 132 to an electronic document from which to manufacture. Note that an electronic document (which for brevity will simply be referred to as a document) can be a file, but does not necessarily correspond to a file. A document may be stored in a portion of a file that holds other documents, in a single file dedicated to the document in question, or in multiple coordinated files.

In any case, the 3D modeling program 116 can create an accurate representation of a combination of the 3D model component(s) 134 and the lattice 136, and provide a document 160 (of an appropriate format) to the manufacturing machine 170 to create a complete structure 180, including lattice structure 185. The manufacturing machine 170 can employ one or more additive manufacturing techniques, such as granular techniques (e.g., Selective Laser Sintering (SLS) and Direct Metal Laser Sintering (DMLS)), extrusion techniques (e.g., Fused Deposition Modeling (FDM)), or subtractive or any other computer aided manufacturing methods. In addition, the user 190 can save or transmit the 3D model 132, with its lattice 136, for later use. For example, the 3D modeling program 116 can store the document 130 that includes the 3D model 132 and its lattice 136.

Figure 2A:
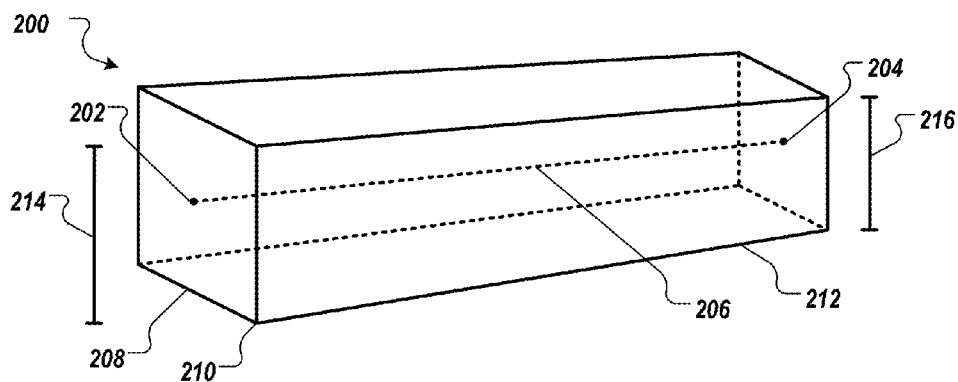
FIG. 2A shows an example of a beam for use in generating a lattice.

FIG. 2A shows an example of a beam 200 for use in generating a lattice. The beam 200 has two beam end points 202, 204, which define an axis 206 of the beam 200. The beam also has a shape (or type) 208, which in this example is square. Other shapes are also possible, as described in further detail below. The beam 200 is a tapered beam having a square cross-section and two different end thicknesses 214, 216. As will be appreciated, there are multiple different ways to represent a beam 200 in memory. For example, the beam 200 can be represented by end points 202, 204, shape/type 208, and thicknesses 214, 216, and from this stored data, corners (e.g., corner 210) and corner lines (e.g., corner line 212) can be readily calculated. Moreover, many different types of beams can be used (both in terms of cross-section shapes and in terms of allowed variation in dimensions) in the same lattice. In addition, the beams in a lattice can be generated using random or arbitrary variation in beam thicknesses, beam number of sides (cross-section profile), and its orientation in respect to its junctions with other beams within the lattice.

Figure 2B:
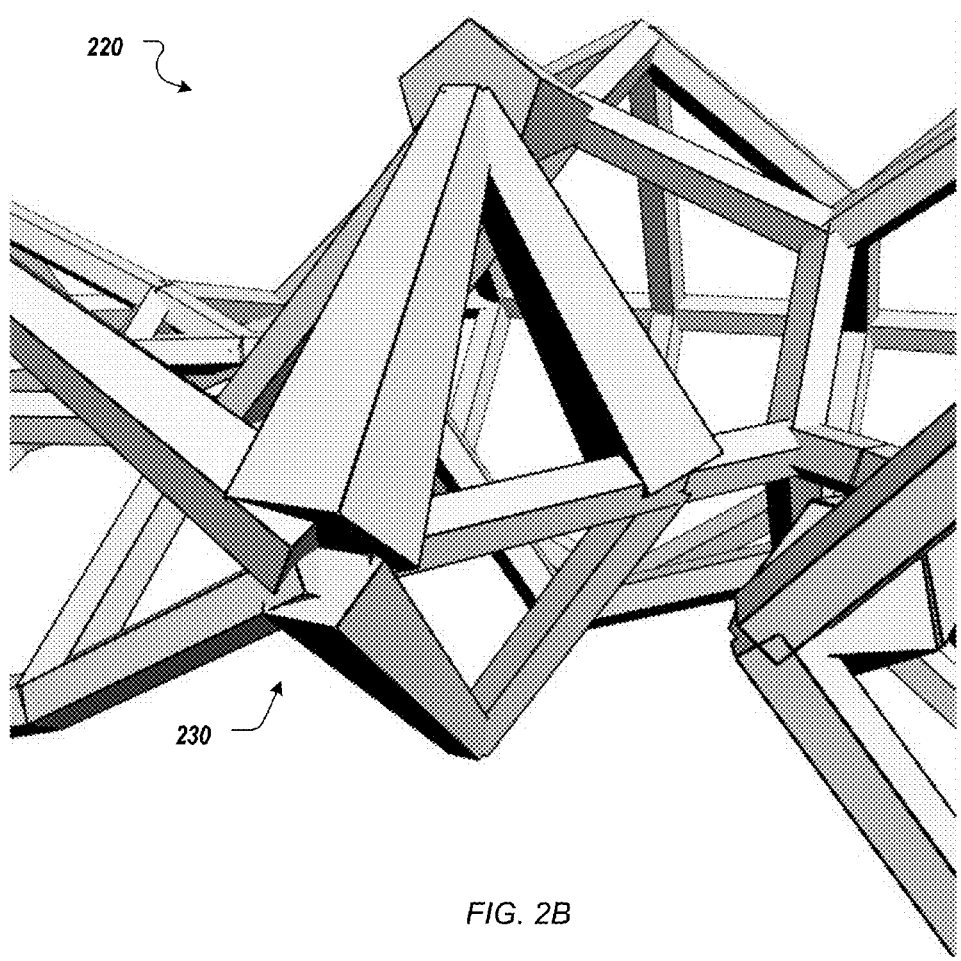
FIG. 2B shows an example of a portion of a lattice, with variation in beams, before junction meshing.

FIG. 2B shows an example of a portion of a lattice 220, with variation in beams, before junction meshing. As shown at junction 230, the lattice 220 can include many different types of beams that are connected to each other at arbitrary angles. The different types of beams can include beams with triangular, rectangular, pentagonal, or hexagonal cross-sections. The dimensions of the beams can vary along their lengths and thus also vary at their end points where they meet at a junction. Moreover, the number of beams that meet at a junction can also vary, both across different lattices and within the same lattice. Generating meshes for lattice structures having such beams can be a computationally intensive process, especially when there are hundreds of thousands of beams in a lattice structure.

Current approaches to generating meshes at the junctions of lattices are based on using Boolean operations on B-rep, on polygon meshes, or on CSG (Constructive Solid Geometry) representations of the beams. Meshing the results from B-rep and CSG methods, and also Boolean operations on polygon meshes are all computationally costly. Moreover, such methods can produce degenerate junctions with voids and brittle sharp angles that need filling, blending, filleting, and/or chamfering.

Figure 2C:
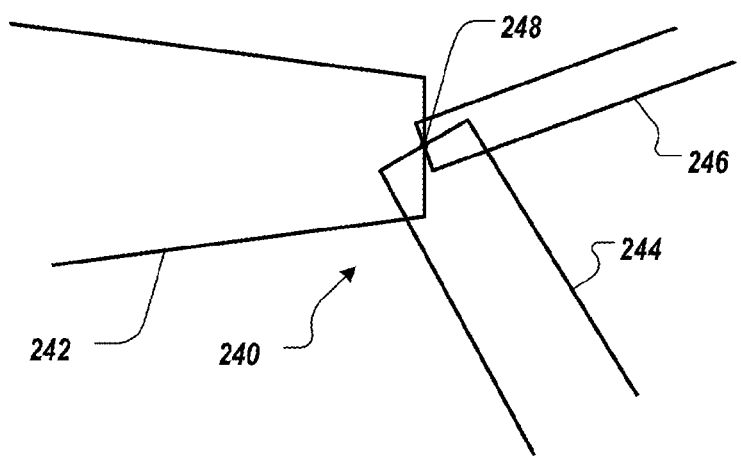
FIGS. 2C-2E show a two dimensional (2D) representation of three beams at a junction and connections thereof.
Figure 2D:
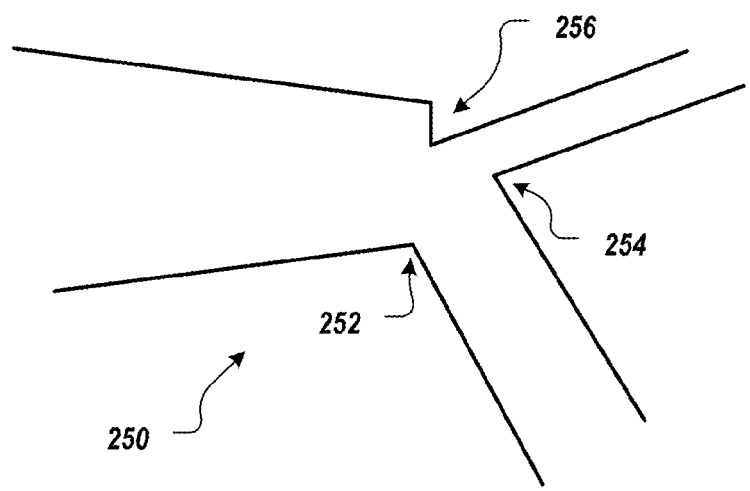

For example, FIG. 2C shows a 2D representation of three different beams 242, 244, 246 meeting at a junction 240. The end points of the beams 242, 244, 246 all meet at a junction center 248, and as shown, the beams have varying amounts of overlap due to their different sizes relative to each other and their different orientations with respect to the junction center 248. As shown in FIG. 2D, when the beams are connected with a traditional Boolean operation approach, the resulting junction 250 includes sharp angles 252, 254, which can make the connections brittle in the lattice structure. In addition, the resulting junction 250 can include voids 256, which can reduce the mechanical strength of the junction significantly.

Figure 2E:
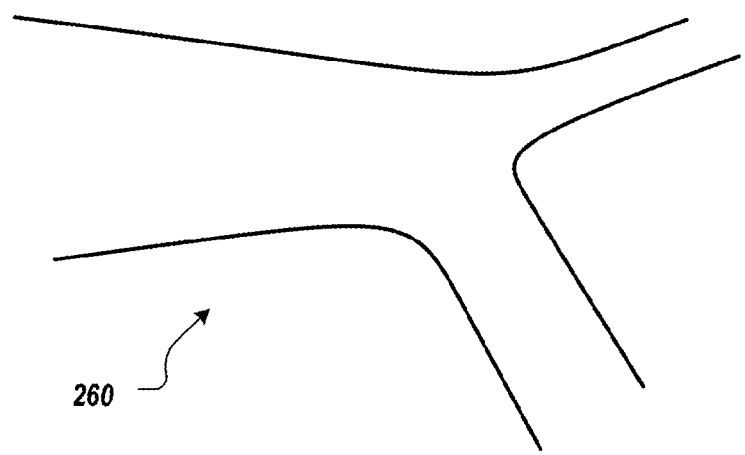

To eliminate such voids and sharp angles, additional processing operations can be used to fill, blend, fillet, chamfer, etc. to produce a near optimal connected junction 260, as shown in FIG. 2E, which is mechanically robust with optimum material use. These extra operations can require a large amount of processing power using traditional methods. But such an approach is usable for a uniform lattice structure since the junction can be calculated and meshed once, and then replicated for all the junctions in the lattice. However, such an approach is not generally feasible and scalable to lattices of many hundred thousands of beams when the beams' thicknesses, angles, and lattice topology are not uniform across the lattice structure, such as in variable thickness, randomly generated lattices, etc.

Figure 3A:
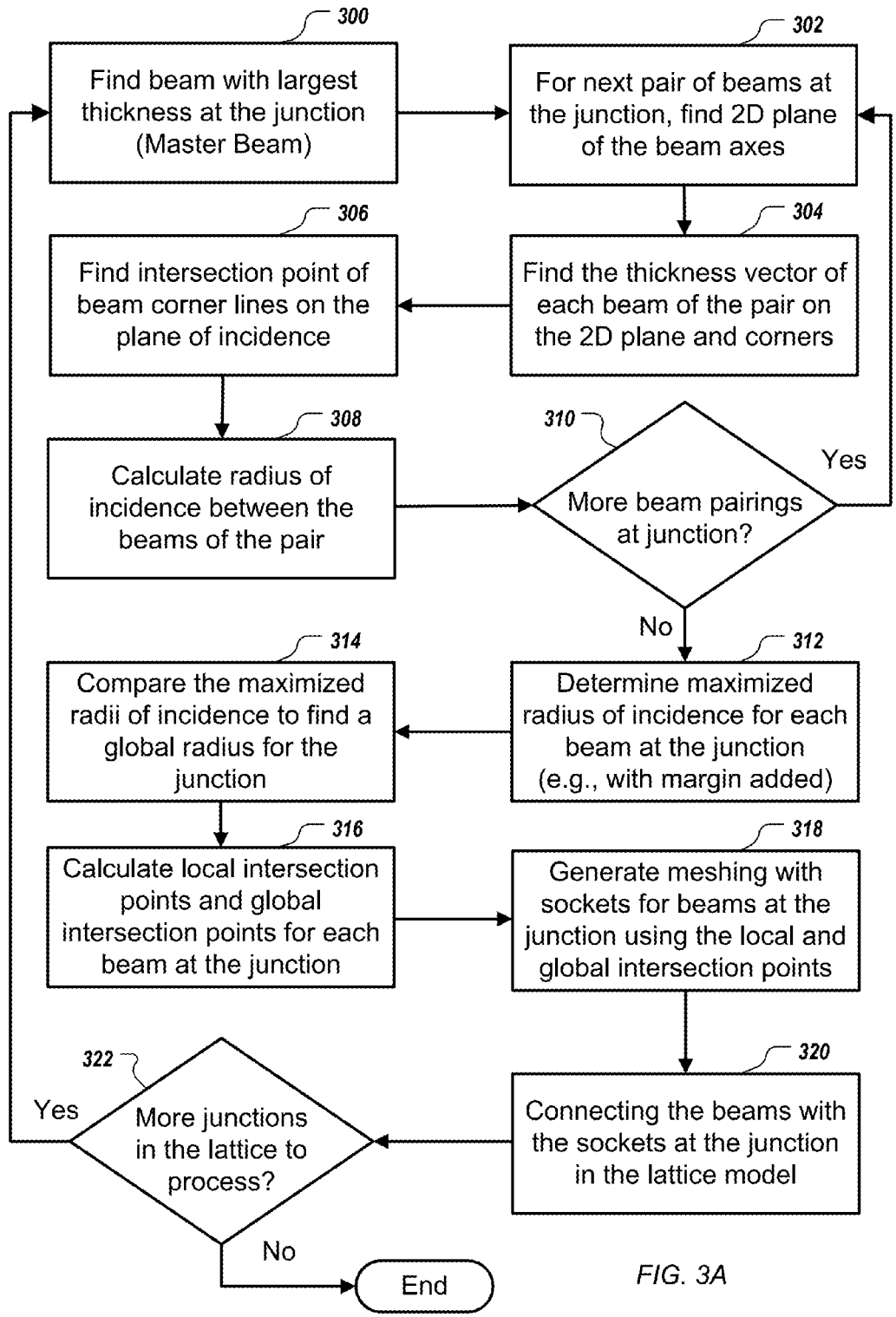
FIG. 3A shows an example of a process to generate junction meshing to connect beams in a 3D lattice.

FIG. 3A shows an example of a process to generate junction meshing to connect beams in a 3D lattice. The beam with the largest thickness can be found 300, which is referred to as the master beam for the junction. As shown in FIG. 2A, each tapered beam 200 has a different thickness value 214, 216 for each end. Since each junction is created from joining a set of beams at one end, and each junction has a center that is the incident point of the axes of all the beams converging on that junction, it is straight forward to find the beam at the junction with the largest thickness, i.e., the master beam for that junction. This is true even when the beams have different shapes, since the thickness of each beam can be measured in a way that is comparable to beams of other types. In general, the algorithm works for essentially any mix of beam profiles in a lattice structure, and while selection of explicitly thickest beam is not required, selection of the thickest beam can provide better results for triangulation. In some implementations, regular beam profiles (e.g., a square profile) can be used, and an ideal circular profile can be defined that has the same cross-section area, where this ideal profile is then discretized into a regular polygon profile of 3, 4, 5, . . . sides keeping the cross sectional area equal to the original square profile.

Note also that finding 300 the master beam is shown and described as being the first operation for a junction, but it need not be the first operation or explicitly a separate operation. For example, finding the master beam can be done as part of the process of calculating a radius of incidence for respective pairings of beams of different sizes that converge at a junction in a lattice. Moreover, in some implementations, the master beam need not be found at all.

In addition, the process described herein for calculating a radius of incidence for respective pairings of beams at each junction can handle any number of beams that converge at a junction, including the case where only two beams come together at a junction. As will be appreciated, more beams converging at a junction means more pairings of beams at the junction, i.e., two beams result in one pairing, three beams result in three pairings, four beams result in six pairings, five beams result in ten pairings, six beams result in fifteen pairings, etc. In general, X beams at a junction result in X!/(X−2)!/2 pairings.

Figure 3B:
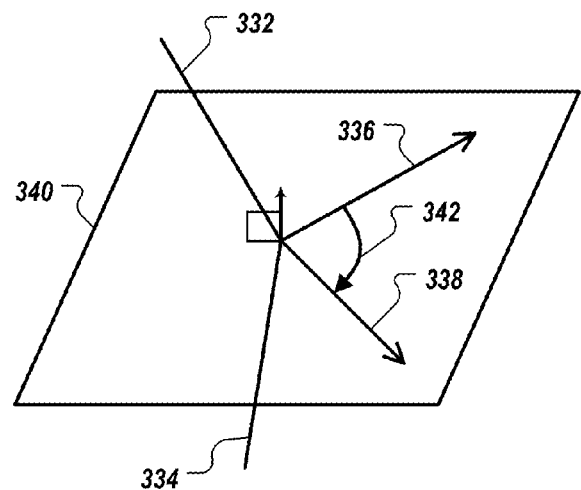
FIG. 3B shows an example of finding a plane of incidence of two beams from a set of four beams.

For a next pair of beams to be processed, the 2D plane of their axes, which is called the plane of incidence, can be found 302 by determining the cross product of the beam axis vectors. FIG. 3B shows an example of finding a plane of incidence 340 of two beam axes 336, 338 from a set of four beam axes 332, 334, 336, 338. Also shown is the angle 342 between the two beam axes 336, 338, plus the normal vector of the plane 340. By definition, in accordance with the cross product, the plane 340 includes each of the two beam axes 336, 338 and is normal to each of the two beam axes 336, 338.

Figure 3C:
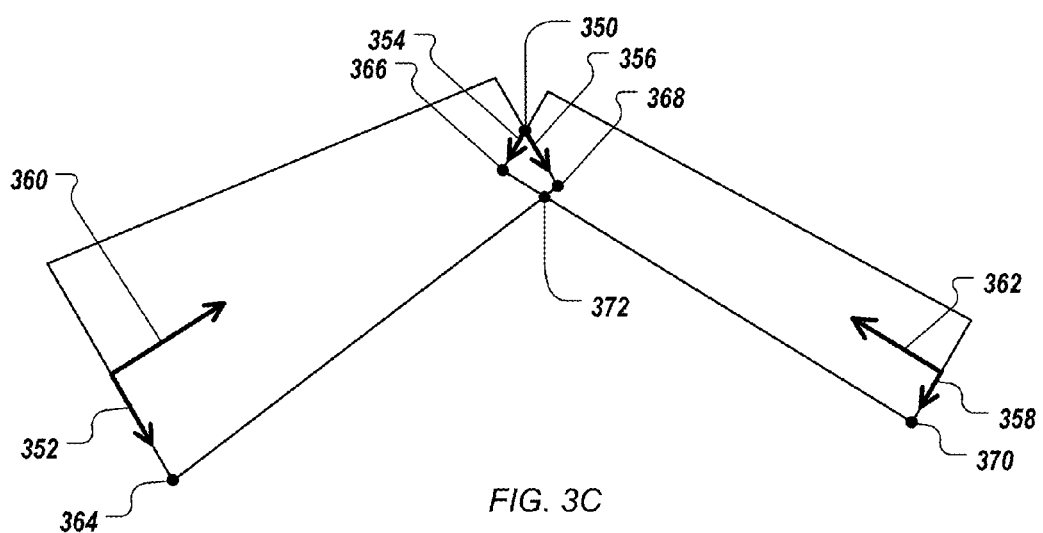
FIG. 3C shows an example of finding thickness vectors for two beams.

A thickness vector of each beam of the pair, on the 2D plane, can then be found 304 by determining the cross product of the normal vector of the plane of incidence and the axis vector of each beam, respectively. Further, using these vectors, beam lengths, and the thickness values at the beam ends, the relevant corners of each beam can be determined. FIG. 3C shows an example of finding thickness vectors 352, 354, 356, 358 for two beams using the axis vectors 360, 362 and the normal vector of the plane, which is perpendicular to the figure, coming out of the page at the center point 350 of the junction. Using these vectors, the corner points 364, 366, 368, 370 can be found, and the intersection point 372 can be found 306 from the corner lines of the beams connecting corners 364, 368 and corners 366, 370.

From the coordinates of this intersection point 372, the radius of incidence between the beams of the pair can be calculated 308. The distance between the intersection point 372 and the center point 350 of the junction is the radius of incidence for this pair of beams. While there are more beam pairings available 310 at the junction, the process of calculating the radius of incidence for each such beam pairing continues.

Once the radius of incidence for each beam pairing at the junction has been determined, a maximized radius of incidence for each beam at the junction can be determined 312. This involves checking, for each beam, which of that beam's radii of incidence is the maximum radius of incidence for that beam. Note that there will be one radius of incidence for each pairing in which a beam has been included. In the case of a junction with only two beams, there will only be one pairing, and so only one radius of incidence, but the process of finding the maximum can be programmed to handle this case as well.

In addition, a margin amount can be added to the determined maximum radius of incidence for each beam to generate the maximized radius of incidence for each respective beam. For example, the determined maximum radius of incidence can be increased in length by 5% or by 2 mm. Other percentage increases are also possible, in various implementations, as well as a constant amount that is added regardless of the length of a current radius to which the margin amount is added. In any case, the resulting maximized radius of incidence for each beam is referred to as the local radius of that beam. It is a radius in the sense that it can be used to define a sphere around the junction center point, and it is local in the sense that all local intersection points for that beam in the context of the other beams that meet at that specific junction will lay on that sphere.

The maximized radii of incidence for the various beams at the junction can be compared 314 to find the largest, which is referred to as the global radius, i.e., the largest of the local radii is taken as the global radius for the junction. Local intersection points and global intersection points can then be calculated 316 for each beam at the junction. The local intersection points are the points in 3D space where the given beam corner lines intersect with the local sphere for that beam, which is defined by the local radius for that beam. The global intersection points are the points in 3D space where the given beam corner lines intersect with the global sphere for the junction, which is defined by the global radius for the junction.

Figure 3D:
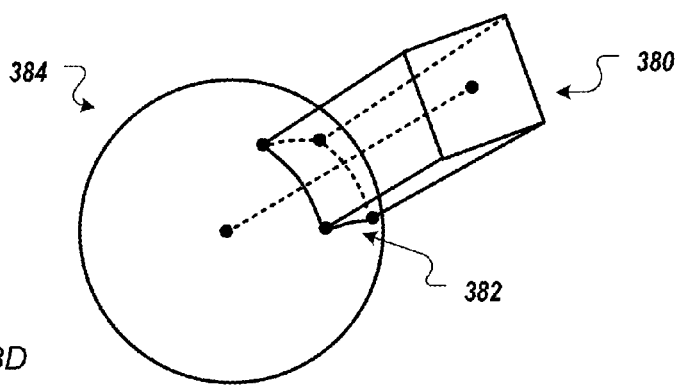
FIG. 3D shows an example of a beam intersecting with a sphere defined by a radius.

FIG. 3D shows an example of a beam 380 intersecting with a sphere 384 defined by a radius. The sphere 384 can represent the global sphere and each of the respective local spheres in turn. Using the radius of the sphere and the known corner lines of the beam 380, the beam intersection points 382 can be determined. The intersection points 382 for the respective spheres can be used to generate 318 meshing with sockets for the beams at the junction. Further, the beams can be connected 320 with the sockets at the junction to form a mechanically robust structure for the lattice. Various approaches can be used to generate the meshing and connect the beams, including those described further below. While there are additional junctions to be processed 322, the method can continue at 300 for the next junction.

Figure 4A:
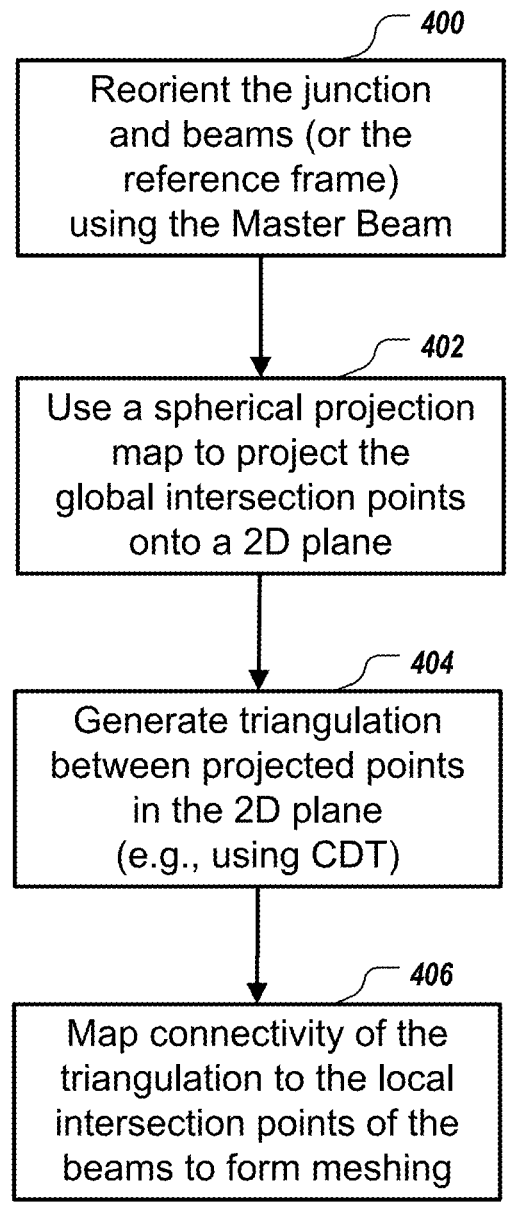
FIG. 4A shows an example of a process to calculate junction meshing with sockets for the connection of beams to a junction in a 3D lattice.

FIG. 4A shows an example of a process to calculate junction meshing with sockets for the connection of beams to a junction in a 3D lattice. As noted above, the master beam (i.e., the thickest of the beams at the junction) can be identified, either here or earlier in the process. The junction and all the beams can be reoriented 400 so that the master beam goes out of the junction in +Z direction. Alternatively, a new frame of reference can be adopted for the junction to accomplish the same result.

A stereographic projection can be used 402, with reference to an axis of the master beam, to project the global intersection points to a 2D plane normal to the axis of the master beam. FIG. 4B shows an example of using a stereographic projection to project points of the master beam onto a 2D plane 420. The intersection 410 of the master beam with the global sphere 412 is shown, where the master beam has been oriented to align its axis with the Z direction. Thus, the 2D plane 420 is an X-Y plane. A stereographic projection projects all the points on the surface (e.g., a point 416) of the global sphere 412 (centered at the junction center) with a light source at the intersection 414 of the axis of the master beam with the sphere 412 onto the X-Y 2D plane 420 normal to the master beam axis at the other intersection of the master beam axis and the sphere to a projected point on the X-Y plane 420 (e.g., projected point 418). As shown, the point 416 is an intersection point of a corner line of another beam with the global sphere 412. Thus, the projection can be used to give a 2D mapping for every intersection of every beam with the global sphere 412 since every beam corner line intersects the global sphere 412 at some location.

FIG. 4C shows an example of stereographic projection of six beam intersections with the global sphere onto the X-Y 2D plane 420. As shown, because the intersection of the master beam is at the topmost part of the global sphere, and given the nature of the stereographic projection, the projection 422 of the master beam intersection points necessarily contains the projections 424 of the remaining five beam intersection points. Note that the particular projected shapes of the beams shown here is just an example. As noted above, the beams can have various numbers of sides and different and even irregular cross-section shapes.

With these projected points determined, triangulation between projected points in the 2D plane 420 normal to the axis of the master beam can be generated 404. For example, this can involve using Constrained Delaunay Triangulation (CDT). FIG. 4D shows an example of the result of using a CDT method to triangulate the space between beam projections on a 2D plane. As shown, connecting lines 426 have been created between the projections in the 2D plane of beam global intersection points, and these connecting lines can be used to build a triangular mesh for the junction with sockets for the beams.

Connectivity of the triangulation can be mapped 406 to the local intersection points of the beams to form a meshing for the junction with sockets for the beams at the junction in the lattice. Note that the connecting lines 426 represent an association between various corner lines of the various beams at the junction. These associations can thus be used to generate connecting lines in the original 3D space between the corresponding local intersection points (socket points) of the beams.

Figure 4E:
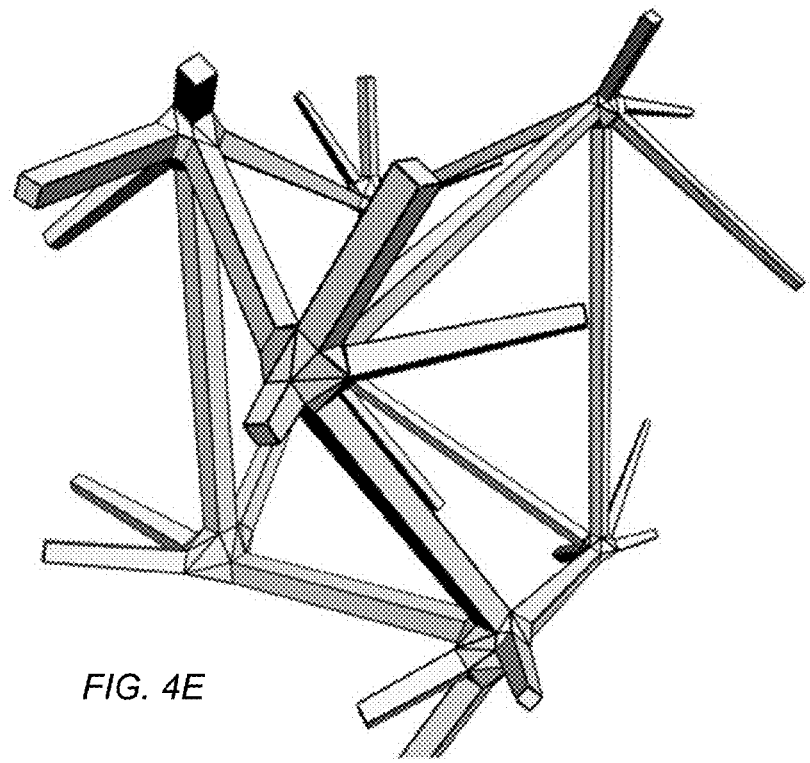
FIGS. 4E and 4F show two examples of the final meshing of junctions.
Figure 4F:
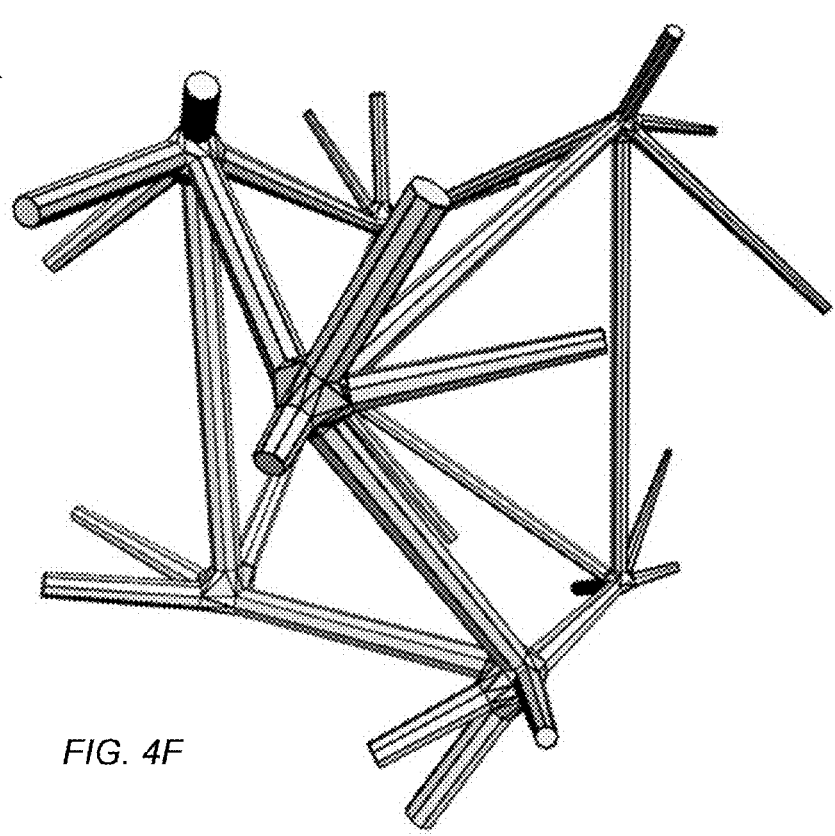

The junction mesh with the right sockets for each beam is then ready, and the beam-ends can be simply connected to their associated sockets by moving the beam end points to beam socket points and merging them together (using the association between each beam corner line and each local intersection point). FIGS. 4E and 4F show two examples 430, 440 of the final meshing of junctions between beams with square and octagon cross-section shapes respectively.

Figure 5A:
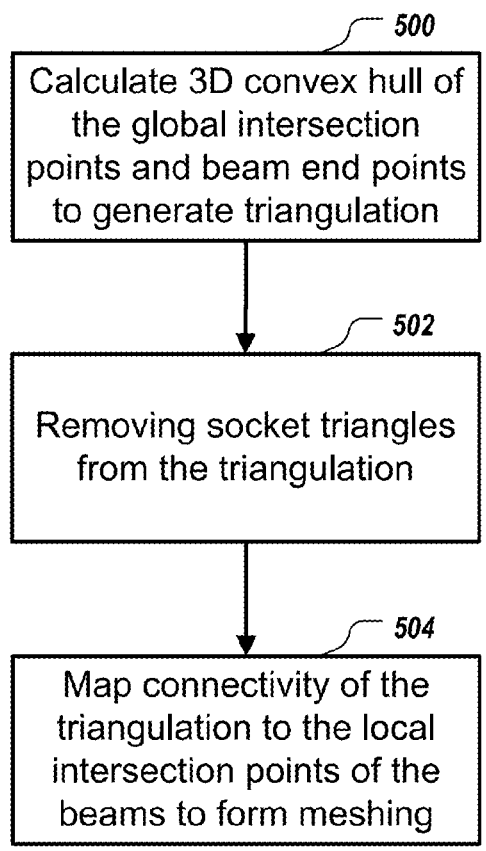
FIG. 5A shows another example of a process to calculate junction meshing with sockets for the connection of beams to a junction in a 3D lattice.

FIG. 5A shows another example of a process to calculate junction meshing with sockets for the connection of beams to a junction in a 3D lattice. Triangulation between the global intersection points can be generated by calculating 500 a 3D convex hull of the global intersection points. This creates the associations between the various corner lines of the various beams at the junction, without the use of a 2D projection mapping. Note that this technique creates triangles that would also cover the sockets being created, so these socket triangles can be removed 502. This removal 502 can be done either before or after the connectivity of the triangulation is mapped 504 to the local intersection points of the beams to form the meshing with sockets for the beams at the junction in the lattice. Using this method may improve the computational efficiency in some implementations.

In addition, in some implementations, both the global intersection points and end points of the beams at the junction can be used as input to the convex hull 3D computation.

Figure 5B:
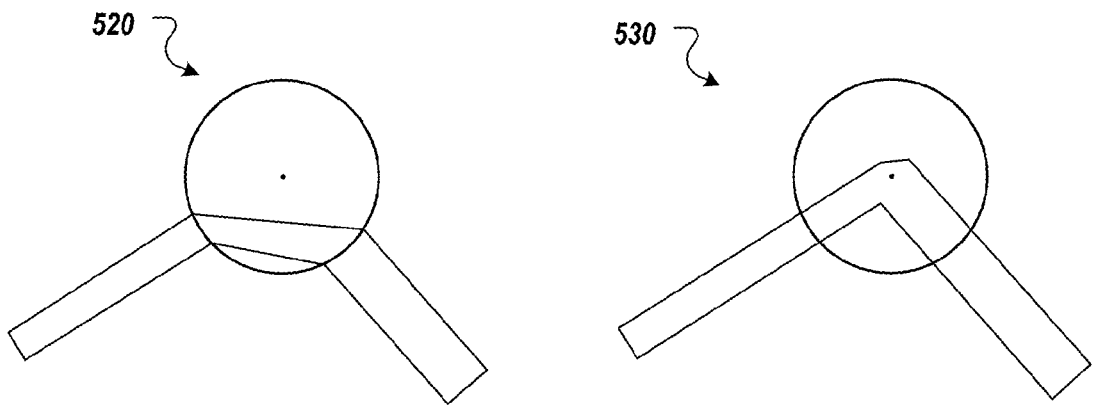
FIG. 5B shows a potential advantage of the approach described in connection with FIG. 5A as compared with the approach described in connection with FIG. 4A.

This approach to calculating junction meshing allows beam end corner points, which usually lie inside the junction, to be added to the convex hull in step 500 to generate reasonable junction shapes in cases where one can find a plane that goes through the junction center where all the beams are on the same side of that plane. FIG. 5B shows a potential advantage of adding beam end corner points in the approach described in connection with FIG. 5A, which can generate an output 530 with two beams, as compared with the approach described in connection with FIG. 4A (or not adding the beam end corner points), which can generate an output 520 with two beams.

Furthermore, regardless of which approach is used to calculate the junction meshing, in some implementations, each beam socket point can have its own local radius. To calculate the local radius of a beam socket point, a list can be generated of all the beams where an edge exists (in the triangulation) between this socket point and a socket point of those beams. Then, the radii of incidence of this beam with every beam in that list can be compared to find the largest value. The local radius of the beam socket point is equal to the maximum of all these radii of incidence.

Figure 6:
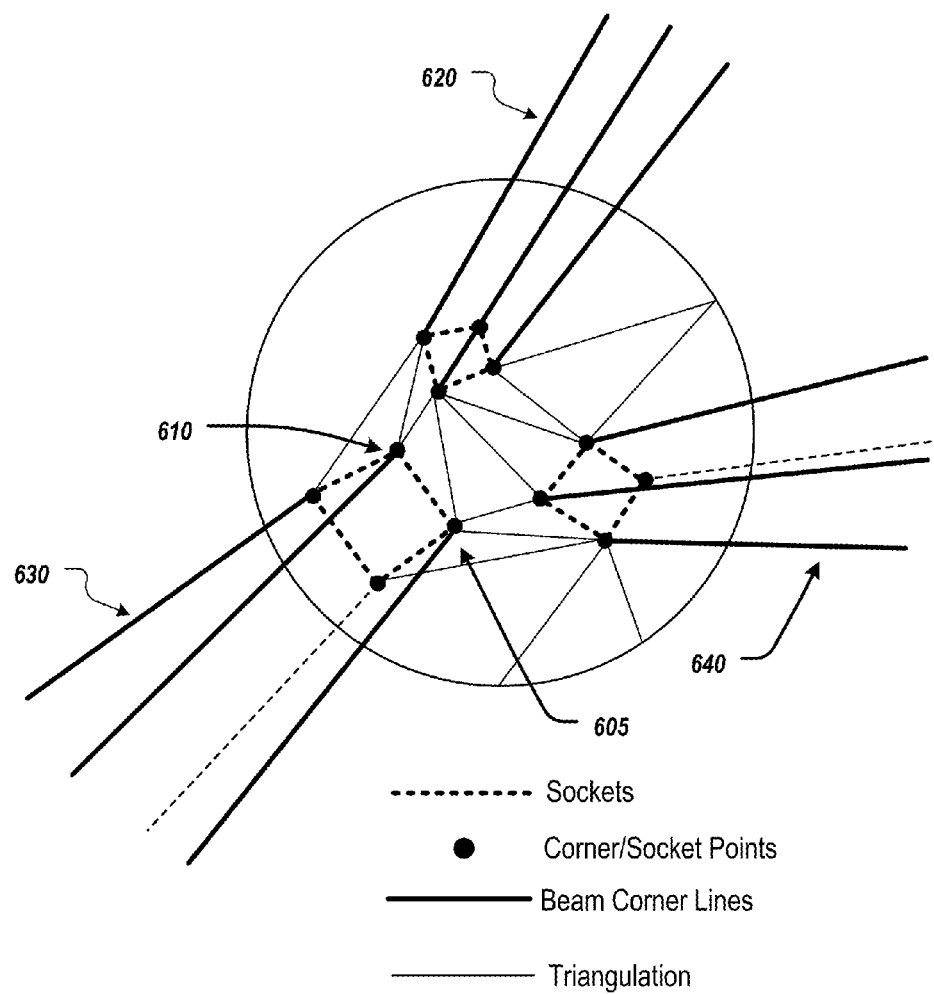
FIG. 6 shows an example of calculation of the local radius for socket points, showing corner lines, socket points and the triangulation (edges) between socket points.

FIG. 6 shows an example of corner lines, socket points and the triangulation (edges) between socket points, along with calculation of the local radius for a socket point. A socket point 605 of beam 630 has edges with socket points of beam 620 and 640. The general rule is that the local radius of a socket point can be the maximum of the radii of incidence of this beam with all the beams with which this socket points has an edge. Therefore, the local radius of socket point 605 is the larger value between the radius of incidence of beams 630 and 620 and radius of incidence of beams 630 and 640. Similarly, for socket point 610 of beam 630, which has edges with only one other beam (620), the local radius for this beam socket point is radii of the incidence of beam 620 and beam 630. In the special case shown, because the socket point has edges with only one other beam, the maximum is equal to the single radius of incident of this beam 620 and that beam 630. In addition, every socket point can be moved along the corresponding beam corner line to this radius distance from the center of the junction. This can improve the material efficiency (volume) of the junction.

Figure 7A:
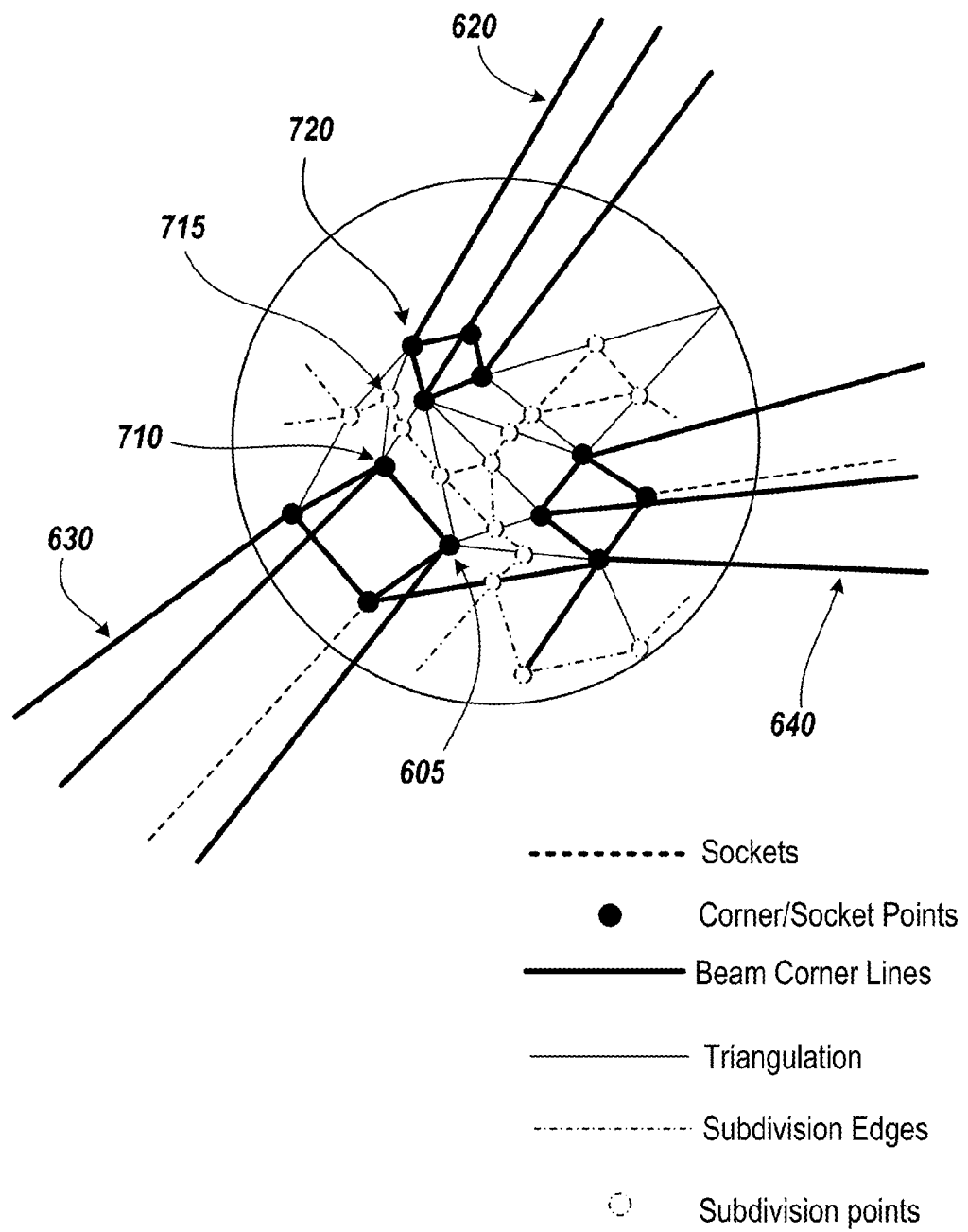
FIGS. 7A & 7B show an example of using the intersection point of the two beam corner lines as the mid control point for a blending function.
Figure 7B:
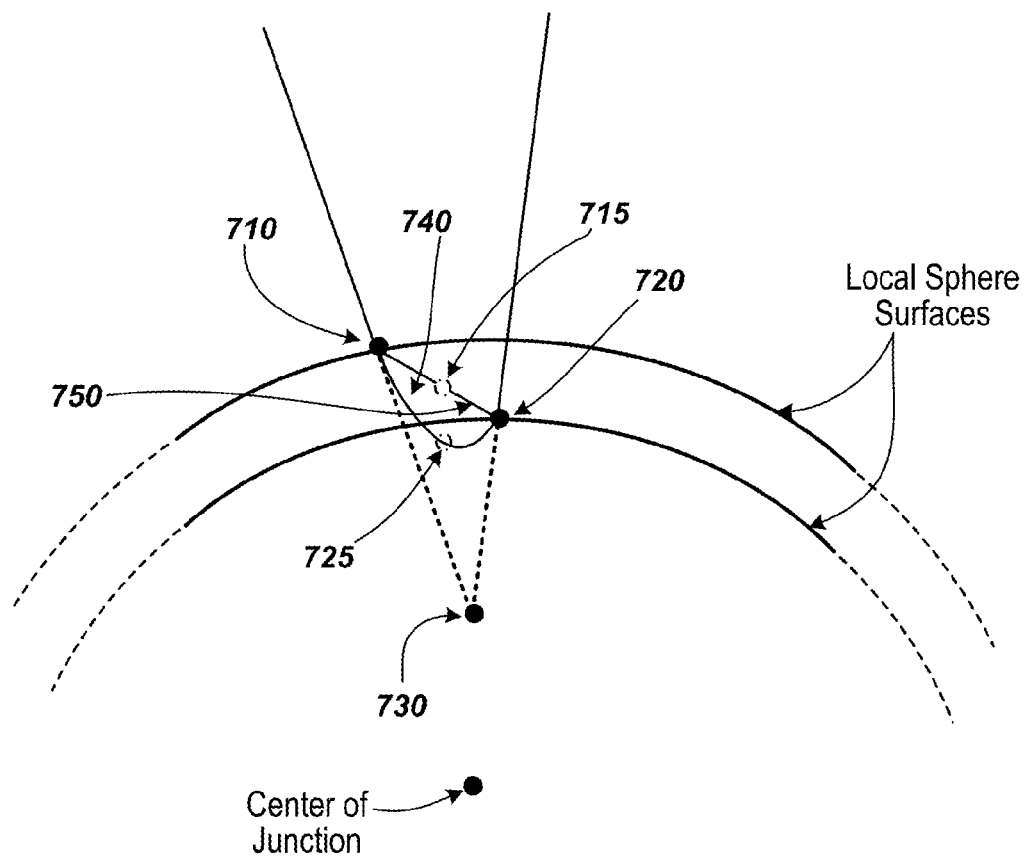

In addition, the edges (thus the triangles) between sockets (the dash-dot lines in FIG. 7A) can be subdivided using a number of subdivision points (the dash-dot circles in FIG. 7A, such as, subdivision point 715), and the radius of each subdivision point (distance from center of the junction) can be determined using a blending function, such as Bezier curves, etc. The end control points of the blending function can be the two socket points of each original edge, for example, points 720 and 710 in FIG. 7A, which are also shown in FIG. 7B. The middle control point can be the intersection point of the two beam corners, for example, point 730 in FIG. 7B.

FIG. 7B shows an example of using the intersection points 710 and 720 of the two beam corner lines (with the local sphere surfaces) as the end control points for the blending function. The intersection point 730 of the corner lines of two beams is defined as the midpoint of the shortest distance between two corner lines. The blending function gives a curve 740 in the 3D space, and the new position 725 of the subdivision point 715 on the original edge 750 between socket points 710 and 720 can be determined by this curve using the proportional distance of the subdivision point from the socket points. This allows specifying the new position of any number of subdivision points between the edges in case that subdivision of the edges between beam sockets is repeated more than once resulting in many subdivision points.

Figure 8:
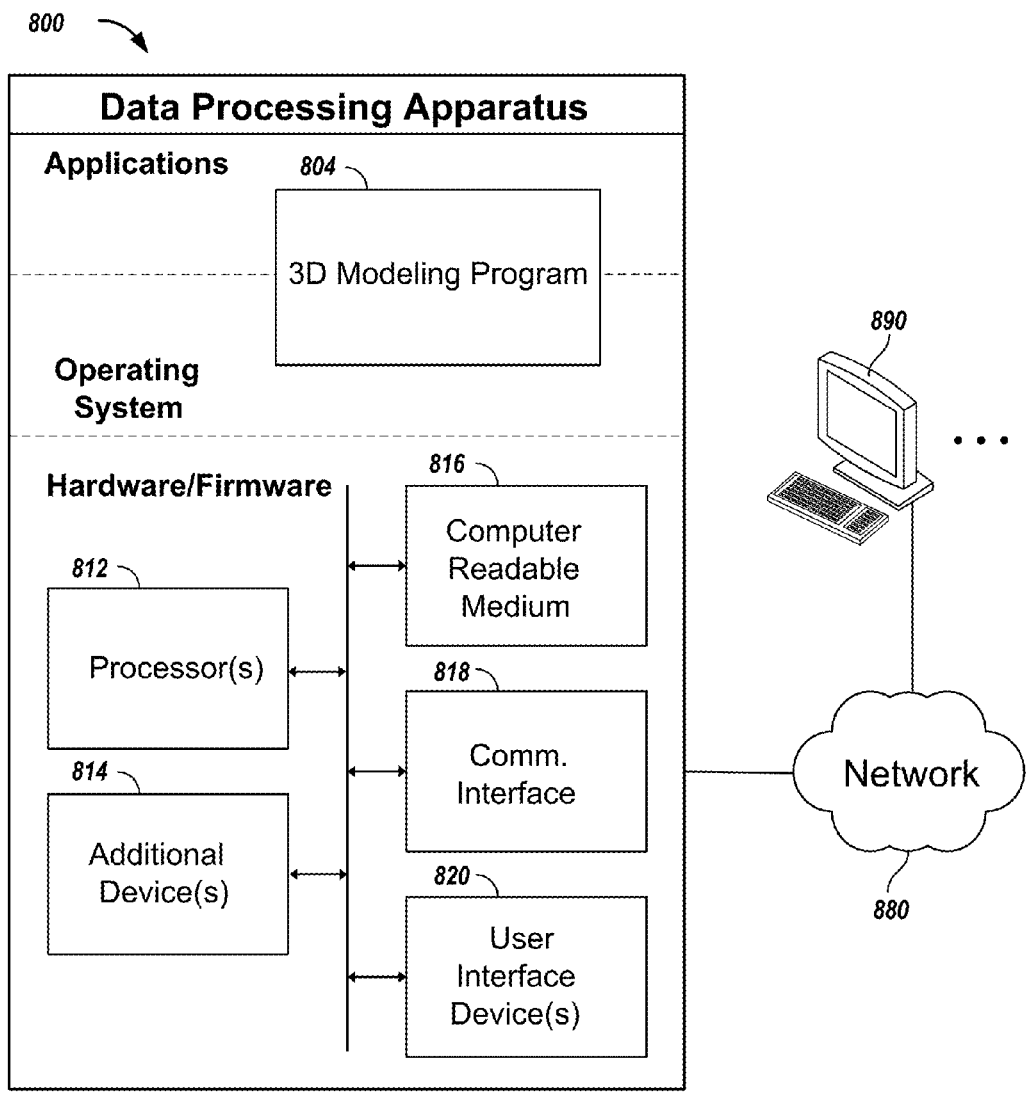
FIG. 8 is a schematic diagram of a data processing system.

FIG. 8 is a schematic diagram of a data processing system including a data processing apparatus 800, which can be programmed as a client or as a server. The data processing apparatus 800 is connected with one or more computers 890 through a network 880. While only one computer is shown in FIG. 8 as the data processing apparatus 800, multiple computers can be used. The data processing apparatus 800 includes various software modules, which can be distributed between an applications layer and an operating system.

These can include executable and/or interpretable software programs or libraries, including tools and services of a 3D modeling program 804, such as described above. The number of software modules used can vary from one implementation to another. Moreover, the software modules can be distributed on one or more data processing apparatus connected by one or more computer networks or other suitable communication networks.

The data processing apparatus 800 also includes hardware or firmware devices including one or more processors 812, one or more additional devices 814, a computer readable medium 816, a communication interface 818, and one or more user interface devices 820. Each processor 812 is capable of processing instructions for execution within the data processing apparatus 800. In some implementations, the processor 812 is a single or multi-threaded processor. Each processor 812 is capable of processing instructions stored on the computer readable medium 816 or on a storage device such as one of the additional devices 814. The data processing apparatus 800 uses its communication interface 818 to communicate with one or more computers 890, for example, over a network 880. Examples of user interface devices 820 include a display, a camera, a speaker, a microphone, a tactile feedback device, a keyboard, and a mouse. The data processing apparatus 800 can store instructions that implement operations associated with the modules described above, for example, on the computer readable medium 816 or one or more additional devices 814, for example, one or more of a floppy disk device, a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A method performed by a three dimensional (3D) modeling program on a computer comprising a processor and a memory, the method comprising:
    calculating a radius of incidence for respective pairings of three or more beams of different sizes that converge at a junction in a lattice;
    determining a maximized radius of incidence for each of the three or more beams based on the radii of incidence for the pairings with each respective one of the three or more beams;
    comparing the maximized radii of incidence to find a global radius for the junction;
    calculating local intersection points and global intersection points, respectively, for each of the three or more beams with a local sphere defined by the maximized radius of incidence for that beam and with a global sphere defined by the global radius for the junction;
    generating meshing with sockets for the three or more beams at the junction using the local intersection points and the global intersection points;
    connecting the three or more beams with the sockets at the junction to form a mechanically robust structure for the lattice; and
    additively manufacturing the mechanically robust structure for the lattice.

2. The method of claim 1, wherein each of the three or more beams of different sizes is a tapered beam represented by an axis, a first end beam thickness value and a second end beam thickness value, the lattice is generated using variation in beam thickness and junction placement within the lattice.

3. The method of claim 2, wherein each tapered beam is further represented by a cross-sectional two dimensional (2D) shape corresponding to beam cross section profile, and the lattice is generated using variation in the beam cross section profile.

4. The method of claim 1, wherein calculating a radius of incidence for a pair of the three or more beams at the junction comprises:
calculating a cross product of beam axis vectors for the two beams of the pair to find a normal vector defining a 2D plane in which the beam axis vectors lie at the junction;
calculating a cross product of the normal vector with a first of the beam axis vectors to find a first thickness vector in the 2D plane at the junction;
calculating a cross product of the normal vector with a second of the beam axis vectors to find a second thickness vector in the 2D plane at the junction;
calculating an edge intersection point of edges of the two beams within the 2D plane using the first thickness vector, the second thickness vector, and data defining the edges of the two beams; and
finding the radius of incidence from the edge intersection point and a center point of the junction.

5. The method of claim 1, wherein determining a maximized radius of incidence for each of the three or more beams based on the radii of incidence for the pairings with that beam comprises:
determining a maximum radius of incidence; and
adding a margin amount to the determined maximum radius of incidence to generate the maximized radius of incidence.

6. The method of claim 1, wherein generating the meshing with sockets for the three or more beams at the junction in the lattice comprises:
identifying a thickest beam of the three or more beams at the junction in the lattice;
using a stereographic projection with reference to an axis of the thickest beam to project the global intersection points to a 2D plane normal to the axis of the thickest beam;
generating triangulation between projected points in the 2D plane normal to the axis of the thickest beam; and
mapping connectivity of the triangulation to the local intersection points of the three or more beams to form the meshing with sockets for the three or more beams at the junction in the lattice.

7. The method of claim 6, wherein generating the triangulation comprises using Constrained Delaunay Triangulation (CDT).

8. The method of claim 1, wherein generating the meshing with sockets for the beams at the junction in the lattice comprises:
generating triangulation between the global intersection points by calculating a 3D convex hull using as input points, both the global intersection points, and end points of the beams at the junction;
removing socket triangles from the triangulation; and
mapping connectivity of the triangulation to the local intersection points of the beams to form the meshing with sockets for the beams at the junction in the lattice.

9. The method of claim 1, comprising performing the method for multiple junctions in the lattice, wherein the multiple junctions have a varying number of intersecting beams, and at least one junction of the multiple junctions has only two beams meeting at the at least one junction.

10. The method of claim 1, wherein determining the maximized radius of incidence for each of the three or more beams comprises determining a maximized radius of incidence for each of three or more corner lines for each of the three or more beams based on radii of incidence for pairings of that corner line's beam with beams connected with that corner line's socket point by triangulation, and wherein calculating the local intersection points comprises calculating local intersection points for the three or more corner lines of each of the three or more beams with local spheres defined by the maximized radius of incidence for each of the three or more corner lines of each respective beam.

11. The method of claim 1, wherein generating the meshing with sockets for the beams at the junction in the lattice comprises:
generating triangulation using the global intersection points, the triangulation comprising edges between corner lines of different beams;
subdividing the edges between the corner lines of the different beams to form subdivision points; and
determining a new position for each of the subdivision points using a blending function, each new position being closer to a center point of the junction than a previous position for that subdivision point.

12. A system comprising:
a non-transitory storage medium having instructions of a three dimensional (3D) modeling program stored thereon; and
one or more data processing apparatus configured to run the instructions of the 3D modeling program to (i) calculate a radius of incidence for respective pairings of three or more beams of different sizes that converge at a junction in a lattice, (ii) determine a maximized radius of incidence for each of the three or more beams based on the radii of incidence for the pairings with each respective one of the three or more beams, (iii) compare the maximized radii of incidence to find a global radius for the junction, (iv) calculate local intersection points and global intersection points, respectively, for each of the three or more beams with a local sphere defined by the maximized radius of incidence for that beam and with a global sphere defined by the global radius for the junction, (v) generate meshing with sockets for the three or more beams at the junction using the local intersection points and the global intersection points, and (vi) connect the three or more beams with the sockets at the junction to form a mechanically robust structure for the lattice, and (vii) cause additive manufacturing of the mechanically robust structure for the lattice.

13. The system of claim 12, wherein each of the three or more beams of different sizes is a tapered beam represented by an axis, a first end beam thickness value and a second end beam thickness value, the lattice is generated using variation in beam thickness and junction placement within the lattice.

14. The system of claim 13, wherein each tapered beam is further represented by a cross-sectional two dimensional (2D) shape corresponding to beam cross section profile, and the lattice is generated using variation in the beam cross section profile.

15. The system of claim 12, wherein the one or more data processing apparatus are configured to run the instructions of the 3D modeling program to calculate a radius of incidence for a pair of the three or more beams at the junction by performing operations comprising:
- calculating a cross product of beam axis vectors for the two beams of the pair to find a normal vector defining a 2D plane in which the beam axis vectors lie at the junction;
- calculating a cross product of the normal vector with a first of the beam axis vectors to find a first thickness vector in the 2D plane at the junction;
- calculating a cross product of the normal vector with a second of the beam axis vectors to find a second thickness vector in the 2D plane at the junction;
- calculating an edge intersection point of edges of the two beams within the 2D plane using the first thickness vector, the second thickness vector, and data defining the edges of the two beams; and
- finding the radius of incidence from the edge intersection point and a center point of the junction.

16. The system of claim 12, wherein the one or more data processing apparatus are configured to run the instructions of the 3D modeling program to determine a maximized radius of incidence for each of the three or more beams based on the radii of incidence for the pairings with that beam by performing operations comprising:
- determining a maximum radius of incidence; and
- adding a margin amount to the determined maximum radius of incidence to generate the maximized radius of incidence.

17. The system of claim 12, wherein the one or more data processing apparatus are configured to run the instructions of the 3D modeling program to generate the meshing with sockets for the three or more beams at the junction in the lattice by performing operations comprising:
- identifying a thickest beam of the three or more beams at the junction in the lattice;
- using a stereographic projection with reference to an axis of the thickest beam to project the global intersection points to a 2D plane normal to the axis of the thickest beam;
- generating triangulation between projected points in the 2D plane normal to the axis of the thickest beam; and
- mapping connectivity of the triangulation to the local intersection points of the three or more beams to form the meshing with sockets for the three or more beams at the junction in the lattice.

18. The system of claim 12, wherein the one or more data processing apparatus are configured to run the instructions of the 3D modeling program to generate the meshing with sockets for the beams at the junction in the lattice by performing operations comprising:
- generating triangulation between the global intersection points by calculating a 3D convex hull using as input points, both the global intersection points, and end points of the beams at the junction;
- removing socket triangles from the triangulation; and
- mapping connectivity of the triangulation to the local intersection points of the beams to form the meshing with sockets for the beams at the junction in the lattice.

19. The system of claim 12, wherein the one or more data processing apparatus are configured to run the instructions of the 3D modeling program for multiple junctions in the lattice, wherein the multiple junctions have a varying number of intersecting beams, and at least one junction of the multiple junctions has only two beams meeting at the at least one junction.

20. The system of claim 12, wherein the one or more data processing apparatus are configured to run the instructions of the 3D modeling program to determine a maximized radius of incidence for each of three or more corner lines for each of the three or more beams based on radii of incidence for pairings of that corner line's beam with beams connected with that corner line's socket point by triangulation, and calculate local intersection points for the three or more corner lines of each of the three or more beams with local spheres defined by the maximized radius of incidence for each of the three or more corner lines of each respective beam.

21. The system of claim 12, wherein the one or more data processing apparatus are configured to run the instructions of the 3D modeling program to generate the meshing with sockets for the beams at the junction in the lattice by performing operations comprising:
- generating triangulation using the global intersection points, the triangulation comprising edges between corner lines of different beams;
- subdividing the edges between the corner lines of the different beams to form subdivision points; and
- determining a new position for each of the subdivision points using a blending function, each new position being closer to a center point of the junction than a previous position for that subdivision point.

22. The system of claim 12, further comprising an additive manufacturing machine, wherein the one or more data processing apparatus are configured to run the instructions of the 3D modeling program to generate a 3D model of an object that includes the lattice and output the 3D model to the additive manufacturing machine for additive manufacturing of the object with the mechanically robust structure of the junction of the lattice included therein.

* * * * *